(12) United States Patent  
Wang (10) Patent No.: US 8,963,619 B2  
(45) Date of Patent: Feb. 24, 2015

(54) SEMICONDUCTOR SWITCH

(71) Applicant: Realtek Semiconductor Corporation, Hsinchu (TW)

(72) Inventor: Po-Chih Wang, Kaohsiung (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/297,087

(22) Filed: Jun. 5, 2014

(65) Prior Publication Data

US 2014/0368257 A1    Dec. 18, 2014

(30) Foreign Application Priority Data

Jun. 17, 2013 (TW) .............................. 102121441 A (51) Int. Cl.
*H03K 17/687* (2006.01)
*H03K 17/081* (2006.01)

(52) U.S. Cl.
CPC ............................... *H03K 17/08104* (2013.01)
USPC ........... 327/434; 327/427; 327/436; 327/374; 327/376; 327/377

(58) Field of Classification Search
USPC .......................................................... 327/434
See application file for complete search history.

(56) References Cited

U.S. PATENT DOCUMENTS

| | | | |
|---|---|---|---|
| 3,942,039 A * | 3/1976 | Kikuchi et al. ............... | 327/389 |
| 7,026,858 B2 * | 4/2006 | Tosaka .......................... | 327/427 |
| 2007/0139094 A1 * | 6/2007 | Nakatsuka et al. ........... | 327/430 |

* cited by examiner

*Primary Examiner* — Lincoln Donovan
*Assistant Examiner* — Patrick Chen
(74) *Attorney, Agent, or Firm* — WPAT, P.C.; Anthony King (57) ABSTRACT

The present invention discloses a semiconductor switch comprising a switching unit. Said switching unit includes: a transistor having a drain, a gate and a source; a drain bias resistor coupled to the drain; a drain bias selecting circuit to couple the drain bias resistor with a first or a second drain bias according to the transistor's state; a gate bias resistor coupled to the gate; a gate bias selecting circuit to couple the gate bias resistor with a first or a second gate bias according to the transistor's state; a source bias resistor coupled to the source; and a source bias selecting circuit to couple the source bias resistor with a first or a second source bias according to the transistor's state, wherein the first and second drain biases are different, the first and second gate biases are different, and the first and second source biases are different.

20 Claims, 6 Drawing Sheets

SEMICONDUCTOR SWITCH

BACKGROUND OF THE INVENTION

1. Field of the Invention

The present invention relates to a switch, especially to a semiconductor switch.

2. Description of Related Art

Figure 1:
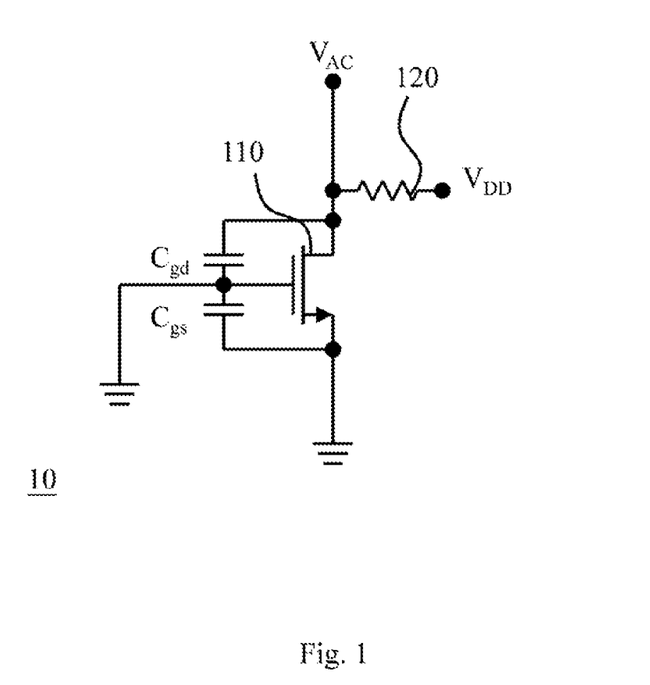
FIG. 1 illustrates a conventional semiconductor switch at an off state.

Semiconductor device has been used as switch for a long time. For instance, one can use a semiconductor device as a transmitter/receiver switch (T/R switch). A conventional T/R switch 10 is illustrated in FIG. 1, comprising a NMOS transistor 110 which includes a gate-to-drain parasitic capacitance $C_{gd}$ and a gate-to-source parasitic capacitance $C_{gs}$. During the period of the transistor 110 being turned off (i.e. the T/R switch stays at an off state), the drain of the transistor 110 is coupled with a DC operating voltage $V_{DD}$ through a bias resistor 120 and receives an AC voltage signal $V_{AC}$, and the gate and source of the transistor 110 is coupled to ground. On the basis of the above, in order to prevent the transistor 110 from being damaged or executing malfunction, in the positive half cycle of the AC voltage signal $V_{AC}$, the drain-to-gate voltage $V_{DG(total)}$ and the drain-to-source voltage $V_{DS(total)}$ of the transistor 110 should be less than the breakdown voltage $V_{BV}$ of the transistor 110; in the negative half cycle of the AC voltage signal $V_{AC}$, the gate-to-drain voltage $V_{GD(total)}$ of the transistor 110 should be less than the threshold voltage $V_{th}$ of the transistor 110. Accordingly, the above-mentioned voltage limitation can be shown with the following equations:

$$V_{DG(total)} = (V_{DD} + V_{AC}) - 0 < V_{BV} \quad \text{(Eq. 1)}$$

$$V_{DS(total)} = (V_{DD} + V_{AC}) - 0 < V_{BV} \quad \text{(Eq. 2)}$$

$$V_{GD(total)} = 0 - (V_{DD} + (-V_{AC})) < V_{th} \quad \text{(Eq. 3)}$$

From equations 1 and 3 (or equations 2 and 3), one can derive the highest AC voltage signal $V_{AC}$ which the transistor 110 is able to sustain being $(V_{BV} + V_{th})/2$; in the meantime, the drain-to-gate DC voltage drop $V_{DG(dc)}$ is $(V_{BV} - V_{th})/2$.

The above-described transistor bias configuration has at least the following problems: when the transistor 110 is turned off and the breakdown voltage $V_{BV}$ is not high enough (e.g. the breakdown voltage $V_{BV}$ is twice or less of the DC operating voltage $V_{DD}$), if the peak value of the AC voltage signal $V_{AC}$ is not less than the DC operating voltage $V_{DD}$, the peak value of the drain voltage of the transistor 110 will be the DC operating voltage $V_{DD}$ plus the peak value of the AC voltage signal $V_{AC}$, that is to say that the peak value is $2V_{DD}$ or more. Meanwhile, because the gate of the transistor 110 is grounded, the highest drain-to-gate voltage drop $V_{DG(total)}$ of the transistor 110 could exceed the breakdown voltage $V_{BV}$ of the transistor 110 (i.e. the aforementioned Eq. 1 is no longer satisfied), and therefore the transistor 110 may be damaged or its lifetime may be reduced.

SUMMARY OF THE INVENTION

In consideration of the imperfections of the prior art, an object of the present invention is to provide a semiconductor switch to prevent the overvoltage and malfunction problems.

The present invention discloses a semiconductor switch applicable to an electronic device. An embodiment of said semiconductor switch comprises a switching unit which includes: a transistor having a drain, a gate and a source; a drain bias resistor coupled to the drain; a drain bias selecting circuit to couple the drain bias resistor with a first drain bias when the transistor is turned on, and couple the drain bias resistor with a second drain bias when the transistor is turned off; a gate bias resistor coupled to the gate; a gate bias selecting circuit to couple the gate bias resistor with a first gate bias when the transistor is turned on, and couple the gate bias resistor with a second gate bias when the transistor is turned off; a source bias resistor coupled to the source; and a source bias selecting circuit to couple the source bias resistor with a first source bias when the transistor is turned on, and couple the source bias resistor with a second source bias when the transistor is turned off, wherein the first and second drain biases are different, the first and second gate biases are different, and the first and second source biases are different.

In the above-mentioned embodiment, the transistor has a breakdown voltage and a threshold voltage, the voltage drop between the second drain bias and the second gate bias is more than a quarter of the breakdown voltage minus the triple of the threshold voltage, and the voltage drop between the second source bias and the second gate bias is more than a quarter of the breakdown voltage minus the triple of the threshold voltage. Furthermore, the voltage drop between the second drain bias and the second gate bias is less than a quarter of triple the breakdown voltage minus the threshold voltage, and the voltage drop between the second source bias and the second gate bias is less than a quarter of triple the breakdown voltage minus the threshold voltage.

An alternative embodiment of the aforementioned semiconductor switch comprises a plurality of said switching units, and the plurality of switching units includes a first switching unit and a second switching unit while the source of the first switching unit is serially connected with the drain of the second switching unit and the source bias resistor of the first switching is the drain bias resistor of the second switching unit.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3a illustrates a circuit diagram equivalent to that of FIG. 2a.

DETAILED DESCRIPTION OF THE PREFERRED EMBODIMENTS

The following description is written by referring to terms of this invention filed. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. In addition, the following description relates to the semiconductor switch technology, and thus the detail known in this filed will be omitted if such detail has little to do with the features of the present invention. Furthermore, the shape, size, and ratio of any element in the disclosed figures are just exemplary for understanding, not for limiting the scope of this invention.

The present invention discloses a semiconductor switch and a transceiver including the semiconductor switch. Said semiconductor switch is applicable to an electronic device which could be an integrated circuit (e.g. a transmitter and/or a receiver) or a device including the integrated circuit (e.g. a wireless signal transmission device), and capable of avoiding circuit damage or malfunction due to overvoltage by the setting of a bias resistor, the connection of a bias selecting circuit and the determination of a bias range. Provided that an implementation of the present invention is applicable, people of ordinary skill in the art can choose components or steps equivalent to those described in this specification to carry out said implementation, which means that the scope of this invention is not limited to the embodiments of the specification. Besides, on account of that some or all elements of the semiconductor switch of the present invention could be known, the detail of such known elements will be omitted provided that this omission nowhere dissatisfies the specification and enablement requirements.

Figure 2A:
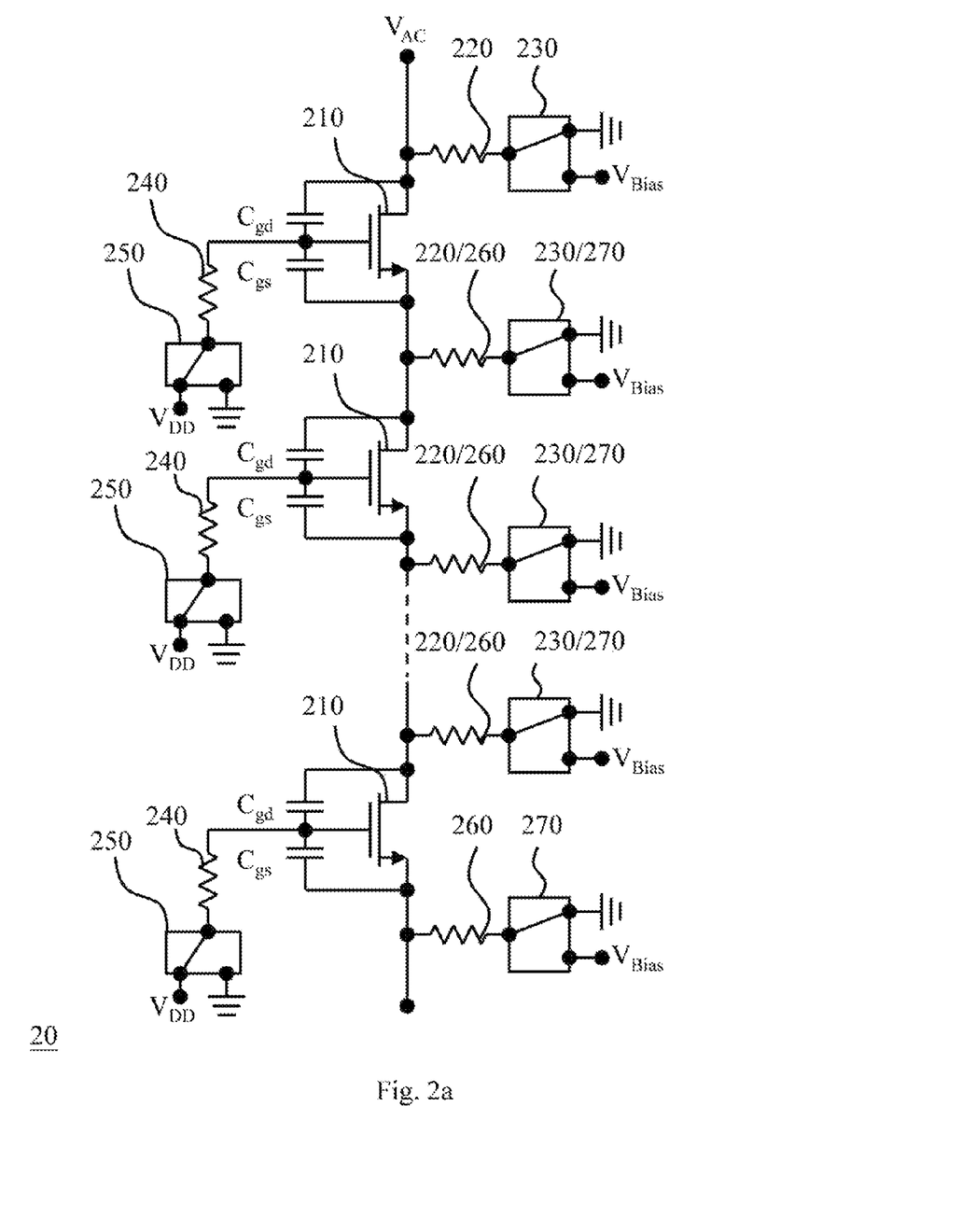
FIG. 2a illustrates the semiconductor switch of the present invention at an on state.
Figure 2B:
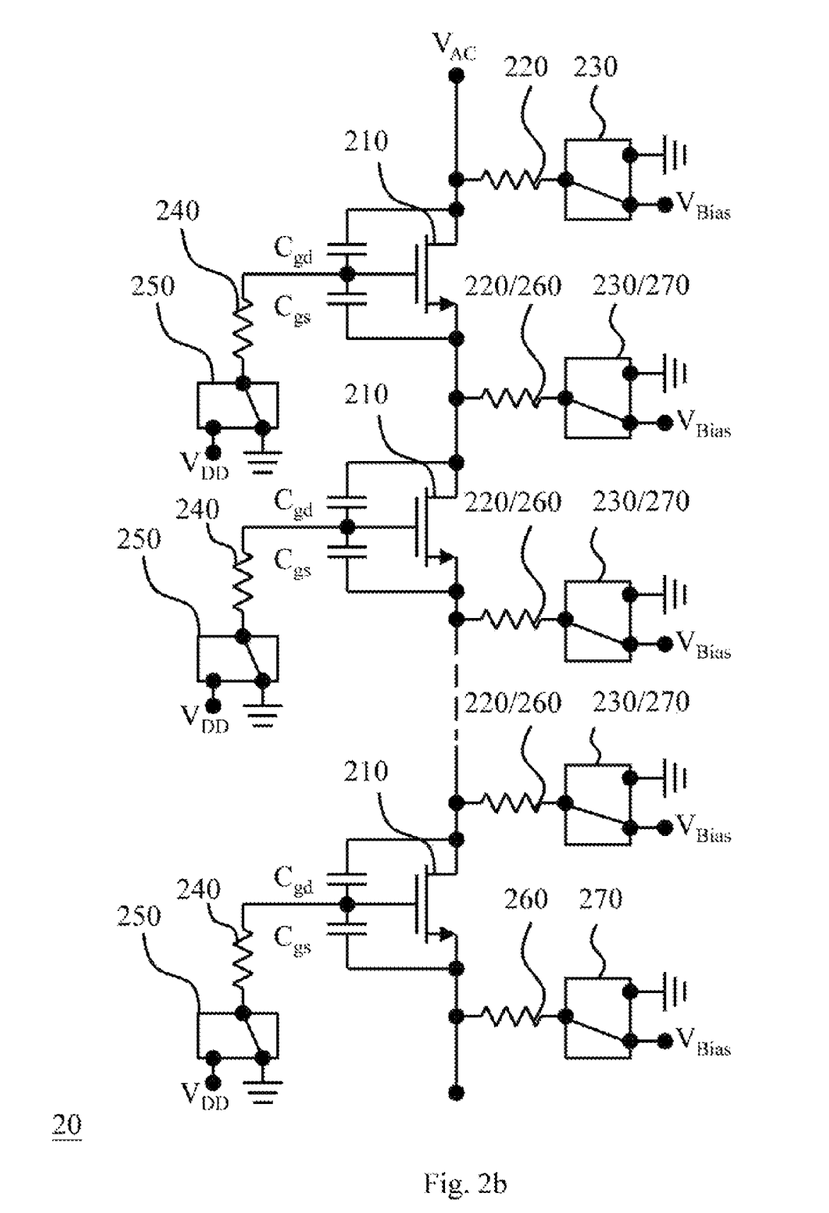
FIG. 2b illustrates the semiconductor switch of the present invention at an off state.
Figure 3A:
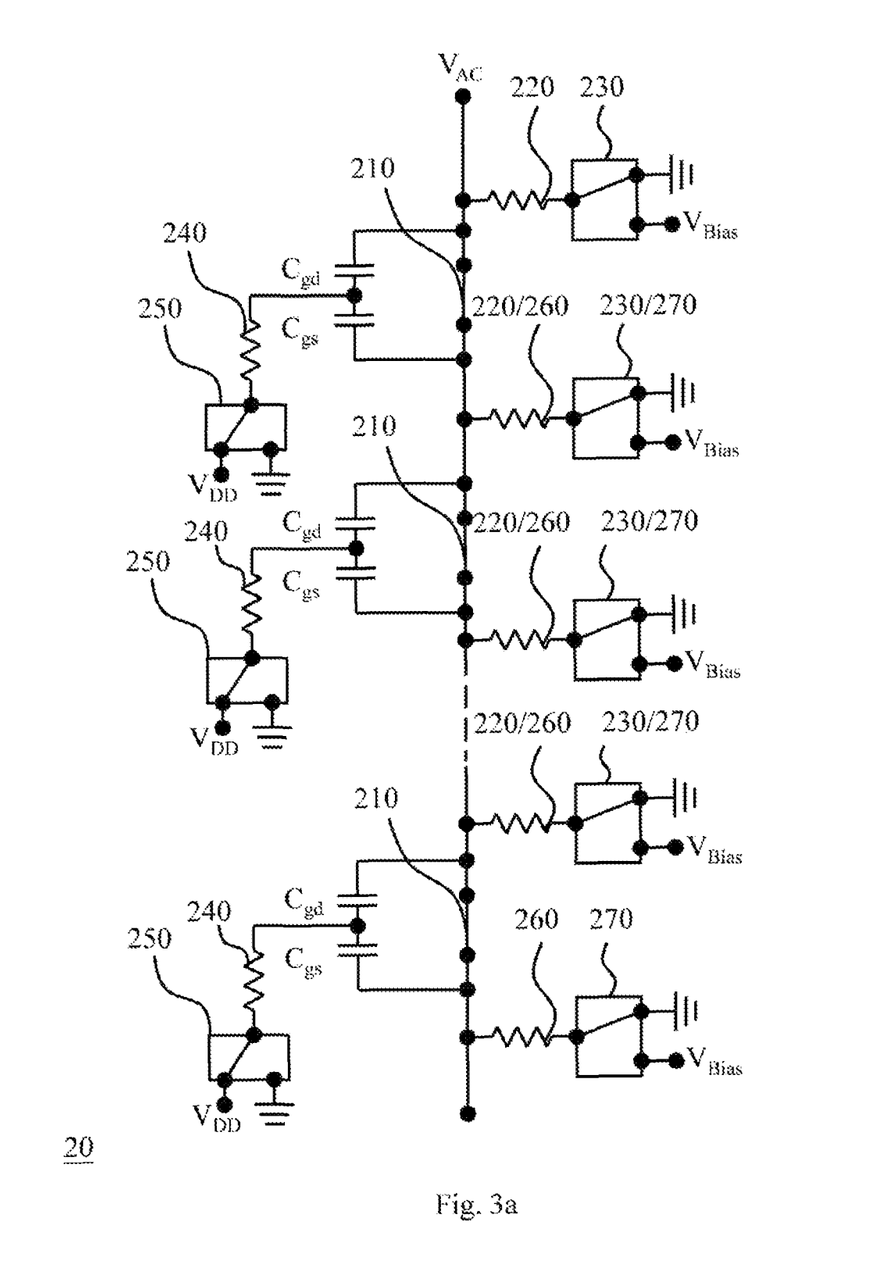
Figure 3B:
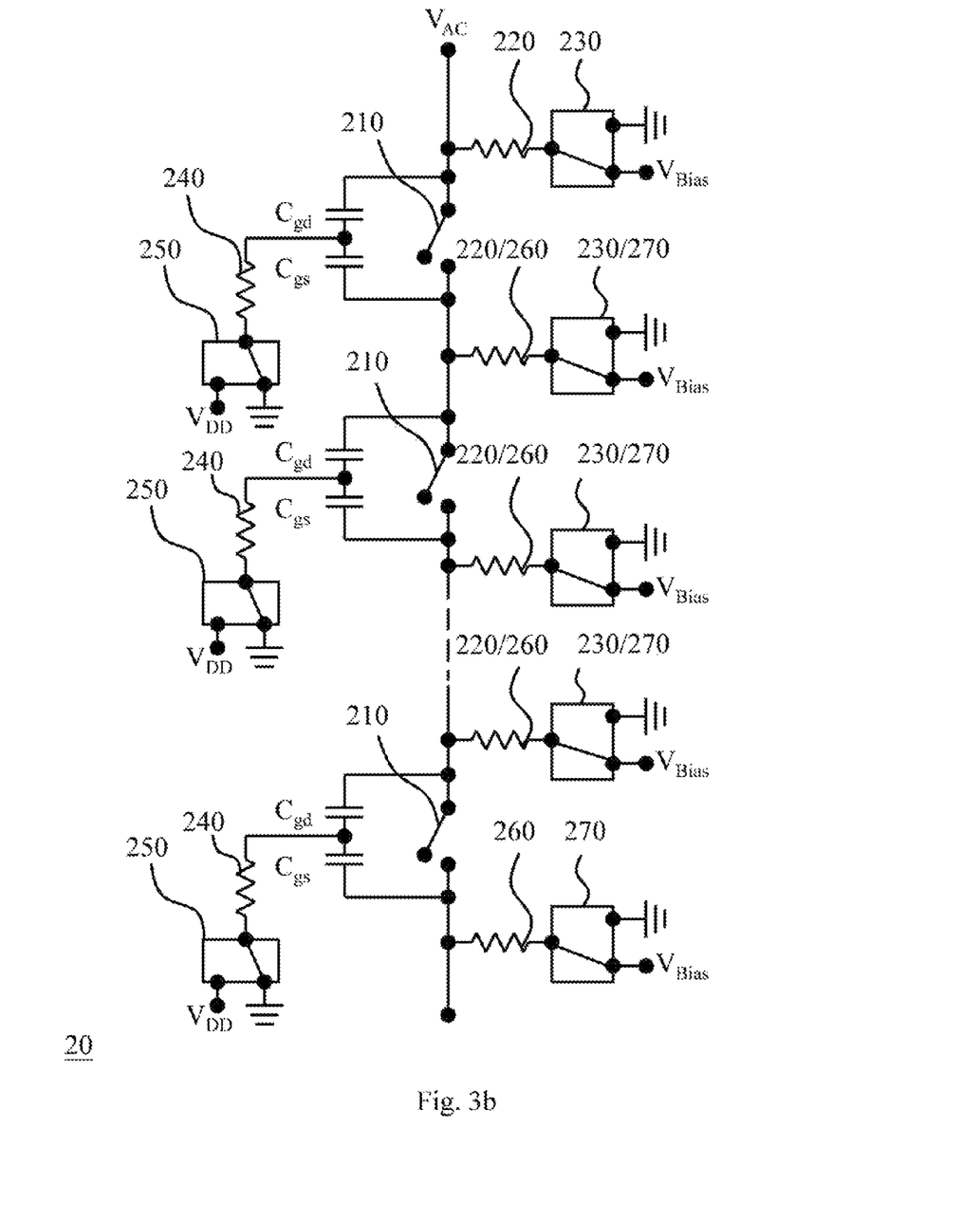
FIG. 3b illustrates a circuit diagram equivalent to that of FIG. 2b.

Please refer to FIG. 2a through FIG. 3b which illustrates an embodiment of the semiconductor switch of the present invention, wherein FIG. 2a illustrates a circuit diagram that the semiconductor switch 20 is at an on state, FIG. 2b illustrates a circuit diagram that the semiconductor switch 20 is at an off state, and FIGS. 3a and 3b illustrate the circuit diagrams equivalent to those of FIGS. 2a and 2b respectively. As shown in the figures, the semiconductor switch 20 of the present embodiment comprises one or more switching units, each of which includes a transistor 210, a drain bias resistor 220, a drain bias selecting circuit 230, a gate bias resistor 240, a gate bias selecting circuit 250, a source bias resistor 260, and a source bias selecting circuit 270. Said transistor 210 includes a drain, a gate and a source, and could be any known MOS transistor (e.g. a known NMOS transistor, a known PMOS transistor, or the appropriate combination thereof) or any semiconductor transistor having the equivalent function. Said drain bias resistor 220 is coupled between the drain of the transistor 210 and a drain DC bias while the drain DC bias is a first drain bias (e.g. a grounding voltage) or a second drain bias (e.g. a designated bias $V_{Bias}$). Said drain bias selecting circuit 230 is operable to couple the drain bias resistor 220 with the first drain bias when the transistor 210 is turned on (i.e. the semiconductor switch 20 is at the on state), and couple the drain bias resistor 220 with the second drain bias when the transistor 210 is turned off (i.e. the semiconductor switch is at the off state). Said gate bias resistor 240 is coupled between the gate of the transistor 210 and a gate DC bias while the gate DC bias is a first gate bias (e.g. a constant voltage) or a second gate bias (e.g. the grounding voltage). Said gate bias selecting circuit 250 is operable to couple the gate bias resistor 240 with the first gate bias when the transistor 210 is turned on, and couple the gate bias resistor 240 with the second gate bias when the transistor 210 is turned off. Said source bias resistor 260 is coupled between the source of the transistor 210 and a source DC bias while the source DC bias is a first source bias (e.g. the grounding voltage) or a second source bias (e.g. the designated bias $V_{Bias}$). Finally, said source bias selecting circuit 270 is operable to couple the source bias resistor 260 with the first source bias when the transistor 210 is turned on, and couple the source bias resistor 260 with the second source bias when the transistor 210 is turned off. In this embodiment, the above-mentioned first and second drain biases are different, the first and second gate biases are different, and the first and second source biases are different.

In light of the above, the first drain bias could be equivalent to the first source bias; for instance, both the biases are the grounding voltage. Furthermore, the second drain bias could be equivalent to the second source bias; for example, both the biases are the designated bias $V_{Bias}$. However, as long as the transistor 210 is able to be turned on and off correctly and free from the damage of overvoltage or malfunction, said biases could be modified and determined by those of ordinary skill in the art. Besides, in the present embodiment, the constant voltage for the gate of the transistor 210 is the voltage for the applied electronic device; more specifically, the constant voltage is a DC operating voltage $V_{DD}$ for the electronic device. But as long as the transistor 210 is able to be turned on and off correctly and free from the damage caused by overvoltage or malfunction, said constant voltage is open to modifications.

Please refer to FIGS. 2b and 3b. In this embodiment, in order to prevent the transistor 210 from the overvoltage damage and malfunction during its off state, the voltage drop $V_{DG(dc)}$ between the second drain bias (e.g. the designated bias $V_{Bias}$) and the second gate bias is better to be more than a quarter of the breakdown voltage $V_{BV}$ minus the triple of the threshold voltage $3V_{th}$, and less than a quarter of triple the breakdown voltage $3V_{BV}$ minus the threshold voltage $V_{th}$, that is to say $(V_{BV}-3V_{th})/4<V_{DG(dc)}<(3V_{BV}-V_{th})/4$; moreover, the voltage drop between the second source bias (e.g. the designated bias $V_{Bias}$) and the second gate bias is better to be more than a quarter of the breakdown voltage $V_{BV}$ minus the triple of the threshold voltage $3V_{th}$, and less than a quarter of triple the breakdown voltage $3V_{BV}$ minus the threshold voltage $V_{th}$, that is to say $(V_{BV}-3V_{th})/4<V_{SG(dc)}<(3V_{BV}-V_{th})/4$, wherein $V_{BV}$ is the breakdown voltage of the transistor 210 while $V_{th}$ is the threshold voltage of the transistor 210. Besides, since the second gate bias is the grounding voltage here, the above-mentioned ranges of the DC voltage drops $V_{DG(dc)}$ and $V_{SG(dc)}$ are also the better ranges for the second drain bias $V_{D(dc)}$ and the second source bias $V_{S(dc)}$ respectively. In other words, if the second drain and source biases are the designated bias $V_{Bias}$, the better range reflects the range of the designated bias $V_{Bias}$. To be more specific, in comparison with the conventional switch configuration and bias specification (as illustrated in FIG. 1 and the description thereof), the transistor 210 in this embodiment is more capable of preventing the occurrence of overvoltage provided that the voltage drop $V_{DG(dc)}$ of the second drain and gate biases and the voltage drop $V_{SG(dc)}$ of the second source and gate biases stay within the above-described ranges; the derivation of these ranges will be explained in the following paragraphs. Please note that the threshold voltage $V_{th}$ of the transistor 210 could be a positive voltage (e.g. the threshold voltage of a NMOS transistor), zero (e.g. the threshold voltage of a depletion NMOS transistor), or a negative voltage (e.g. the threshold voltage of a depletion NMOS transistor or a PMOS transistor). Please also note that if the aforementioned constant voltage is the DC operating voltage $V_{DD}$ and the voltage $V_{DD}$ is highest in the whole circuit, the designated bias $V_{Bias}$ may therefore be limited to the constant voltage (i.e. $V_{Bias} \le V_{DD}$); in the meantime, the better range for the designated bias $V_{Bias}$ will be $(V_{BV}-3V_{th})/4<V_{Bias} \le V_{DD}$ instead. However, the confinement to the range of the designated bias $V_{Bias}$ will not be necessary as long as the concerned implementation is practicable.

In view of the above, the limitation to the aforementioned DC voltage drops $V_{DG(dc)}$, $V_{SG(dc)}$ can be realized through confining the second drain and source biases during the circuit design stage, or using a known voltage regulator or its equivalent to confine the second drain and source biases during the circuit operation stage. Additionally, in the afore-described embodiment, each of the drain bias selecting circuit 230, the gate bias selecting circuit 250 and the source bias selecting circuit 270 alone can be carried out with the known arts, and those of ordinary skill in the art are capable of bringing the selecting circuits 230, 250, 270 into practice on the basis of the disclosure of this specification. Therefore, the redundant or well-known detail thereof will be omitted provided that the disclosure and enablement requirements are still fulfilled.

Please refer to FIG. 2a through FIG. 3b again. In this embodiment, the transistor 210 of each switching unit includes one or several parasitic capacitances (e.g. a gate-to-drain capacitance $C_{gd}$ and a gate-to-source capacitance $C_{gs}$), and all the impedances of the drain bias resistor 220, the gate bias resistor 240 and the source bias resistor 260 are higher than the impedance of any of the parasitic capacitance(s) in a concerned frequency band (e.g. the frequency band of an input signal). For instance, all the impedances of the bias resistors 220, 240, 260 are X times the impedance of the least one of the parasitic capacitance(s) in which X is better to be a value not less than 10. Accordingly, as shown in FIG. 3b, when the semiconductor switch 20 of the present embodiment is at the off state and the transistor 210 is a NMOS transistor, an AC input signal $V_{AC}$ that is input into the drain of one of the transistors 210 will be output from the source of one of the transistors 210 via the one or more parasitic capacitances. For easy understanding, assuming that the semiconductor switch 20 comprises an only switching unit, the parasitic capacitances are a gate-to-drain parasitic capacitance $C_{gd}$ and a gate-to-source parasitic capacitance $C_{gs}$, while the impedances of the two capacitances are the same, all the impedances of the bias resistors 220, 240, 260 are far more than the impedances of the parasitic capacitances $C_{gd}$, $C_{gs}$ and the voltage of the AC input signal $V_{AC}$ les between the positive and negative DC operating voltages $\pm V_{DD}$, the drain voltage $V_{D(total)}$ of the transistor 210 will be the voltage of the AC input signal $V_{AC}$ plus the second drain bias (e.g. $V_{DD}/2$); meanwhile, since the parasitic capacitances $C_{gd}$, $C_{gs}$ share the voltage equally and isolate the DC voltage, the gate voltage $V_{G(total)}$ of the transistor 210 will be a half of the voltage the AC input signal $V_{AC}$; consequently, the voltage drop of the parasitic capacitance $C_{gs}$ will be the remaining half of the voltage of the AC input signal $V_{AC}$ and thus the source voltage $V_{S(total)}$ of the transistor 210 will be equal to the second source bias (e.g. $V_{DD}/2$). In accordance with the above, the drain-to-gate voltage drop $V_{DG(total)}$ of the transistor 210 will be half the AC input signal plus the second drain bias, and the maximum voltage drop $V_{DG(total\_max)}$ of said drain-to-gate voltage drop $V_{DG(total)}$ will be a half of the maximum AC input signal $V_{AC}$ (e.g. $V_{DD}/2$) plus the second drain bias (e.g. $V_{DD}/2$); to be more specific, the maximum voltage drop $V_{DG(total\_max)}$ will be $V_{DD}/2 + V_{DD}/2 = V_{DD}$ for example. Because this maximum voltage drop $V_{DG(total\_max)}$ is apparently lower than the maximum drain-to-gate voltage drop of the prior art (e.g. a voltage not less than $2V_{DD}$ as described in paragraph [0003]) and lower than the breakdown voltage $V_{BV}$ of the transistor 210 (e.g. a voltage that lies between $2V_{DD}$ and $3V_{DD}$), the over-voltage problem which may damage the transistor 210 can be avoided. Similarly, the maximum source-to-gate voltage drop $V_{SG(total\_max)}$ of the transistor 210 will be the second source bias (e.g. $V_{DD}/2$) minus the half of the minimum AC input signal $V_{AC}$ (e.g. $-V_{DD}/2$); more specifically, the maximum voltage drop $V_{SG(total\_max)}$ will be $V_{DD}/2 - (-V_{DD}/2) = V_{DD}$ for example. Since this maximum voltage drop $V_{SG(total\_max)}$ is also obviously lower than the breakdown voltage $V_{BV}$, the function of the transistor 210 is therefore guaranteed.

Please refer to the above description and the prior art of paragraph [0002] of this specification. The conventional switch is able to sustain the AC voltage signal not more than $(V_{BV}+V_{th})/2$. Therefore, if the semiconductor switch 20 of the present embodiment is going to sustain a higher AC voltage signal $V_{AC}$ and keep the drain-to-gate voltage $V_{DG(total)}$ lower than the breakdown voltage $V_{BV}$, the voltage setting of the transistor 210 has to comply with the following equations:

$$V_{AC} > (V_{BV}+V_{th})/2 \quad \text{(Eq. 4)}$$

$$V_{DG(total)} = (V_{D(dc)}+V_{AC}) - (V_{G(dc)}+V_{AC}/2) < V_{BV} \quad \text{(Eq. 5)}$$

$$V_{GD(total)} = (V_{G(dc)}-V_{AC}/2) - (V_{D(dc)}-V_{AC}) < V_{th} \quad \text{(Eq. 6)}$$

$$V_{SG(total)} = V_{S(dc)} - (V_{G(dc)}-V_{AC}/2) < V_{BV} \quad \text{(Eq. 7)}$$

$$V_{GS(total)} = (V_{G(dc)}+V_{AC}/2) - V_{S(dc)} < V_{th} \quad \text{(Eq. 8)}$$

In which $V_{D(dc)}$ is the DC bias for the drain (i.e. the aforementioned second drain bias), $V_{G(dc)}$ is the DC bias for the gate (i.e. the aforementioned second gate bias), and $V_{s(dc)}$ is the DC bias for the source (i.e. the aforementioned second source bias). In this embodiment, $V_{D(dc)}$ and $V_{S(dc)}$ are the aforementioned designated bias $V_{Bias}$ and $V_{G(dc)}$ is the grounding voltage; therefore, the voltage drops $V_{DG(dc)}$ and $V_{SG(dc)}$ are consequently equal to $V_{Bias}$. Furthermore, according to the intersection of Eq. 4 and Eq. 5, the intersection of Eq. 4 and Eq. 6, the intersection of Eq. 4 and Eq. 7 and the intersection of Eq. 4 and Eq. 8, the following four equations are obtained:

$$V_{DG(dc)} = V_{D(dc)} - V_{G(dc)} < (3V_{BV}-V_{th})/4 \quad \text{(Eq. 9)}$$

$$V_{DG(dc)} = V_{D(dc)} - V_{G(dc)} > (V_{BV}-3V_{th})/4 \quad \text{(Eq. 10)}$$

$$V_{SG(dc)} = V_{S(dc)} - V_{G(dc)} < (3V_{BV}-V_{th})/4 \quad \text{(Eq. 11)}$$

$$V_{SG(dc)} = V_{S(dc)} - V_{G(dc)} > (V_{BV}-3V_{th})/4 \quad \text{(Eq. 12)}$$

Accordingly, from Eq. 9 and Eq. 10, the better range, i.e. $(V_{BV}-3V_{th})/4 < V_{DG(dc)} < (3V_{BV}-V_{th})/4$, of the voltage drop $V_{DG(dc)}$ between the second drain and gate biases as taught in paragraph [0019] is obtained; from Eq. 11 and Eq. 12, the better range, i.e. $(V_{BV}-3V_{th})/4 < V_{SG(dc)} < (3V_{BV}-V_{th})/4$, of the voltage drop $V_{SG(dc)}$ between the second source and gate biases is obtained. Moreover, the maximum AC input signal $V_{AC(max)}$ that the semiconductor switch 20 is able to sustain can be derived from Eq. 5 and Eq. 6 to be $(V_{BV}+V_{th})$ while $V_{DG}=V_{SG}=(V_{BV}-V_{th})/2$. In brief, the semiconductor switch 20 of the present embodiment is able to sustain an AC input signal $V_{AC}$ whose amplitude is higher than the DC operating voltage $V_{DD}$.

Please refer to FIG. 2a through FIG. 3b once more. As shown in the figures, when the number of the switching units is more than one, these switching units are connected in series; more specifically, the source of a number M switching unit is serially connected with the drain of a number M+1 switching unit, and the source bias resistor 260 of the number M switching unit is the drain bias resistor 220 of the number M+1 switching unit, wherein the number M and M+1 switching units are adjoining units. In the present embodiment, the aforementioned AC input signal $V_{AC}$ is inputted into the drain of the first switching unit and outputted from the source of the last switching unit; therefore, when the number of the switching units is N (i.e. a positive integer) and both the second drain and source biases are the designated bias $V_{Bias}$, the drain, gate and source voltages of a number K switching unit can be expressed with the following equations:

drain voltage: $V_{D(total\_K)} = V_{Bias} + K \times (V_{AC}/N)$ gate voltage: $V_{G(total\_K)} = (2K-1) \times (V_{AC}/2N)$ source voltage: $V_{S(total\_K)} = V_{Bias} + (K-1) \times (V_{AC}/N)$ In which K is an integer not more than N. In view of the above, assuming that the designated bias $V_{Bias}$ is $V_{DD}/2$ and the voltage of the AC input signal $V_{AC}$ stays between $\pm V_{DD}$, the drain-to-gate voltage drop, i.e. ($V_{Bias} + V_{AC}/2N$), will never exceed $V_{DD}$ and the source-to-gate voltage drop, i.e. ($V_{Bias} - V_{AC}/2N$), will also be equal to or less than $V_{DD}$. Since the two voltage drops are not more than $V_{DD}$, they won't exceed the breakdown voltage $V_{BV}$ (e.g. $2V_{DD}$) of the transistor 210 either and thereby do no harm to the transistor 210. In a word, the switch 20 of the present embodiment can easily sustain an AC input signal $V_{AC}$ whose peak value is higher than the DC operating voltage $V_{DD}$.

In the above-described embodiments, the transistor 210 of each switching unit is a NMOS transistor for illustration. However, a CMOS or PMOS transistor can be used instead in accordance with design requests. Since people of ordinary skill in the art can appreciate how to use a CMOS or PMOS transistor to carry out the present invention by referring to the embodiments of this specification and the well-known arts, the redundant and similar description is thereby omitted.

Figure 4:
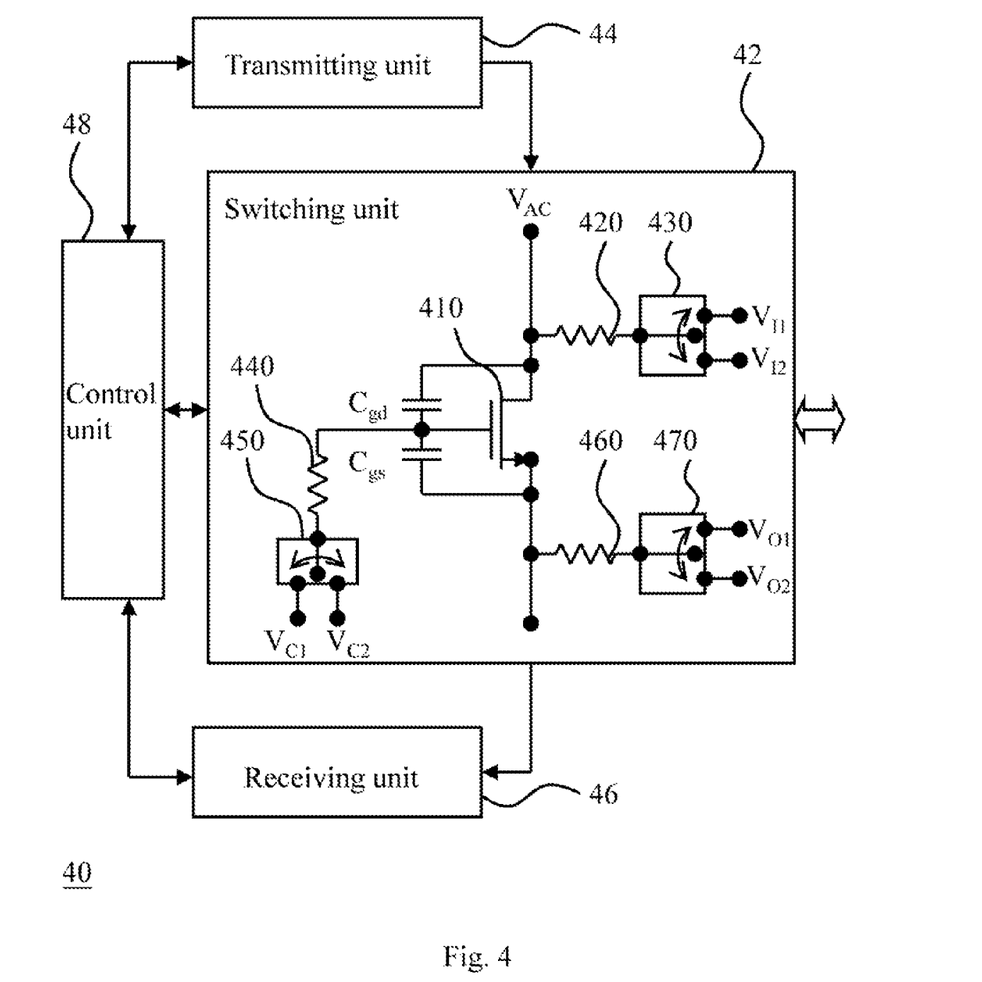
FIG. 4 illustrates a transceiver having the semiconductor of the present invention.

The present invention also discloses a transceiver with a semiconductor switch such as the aforementioned switch 20. As shown in FIG. 4, an embodiment of the transceiver 40 comprises: one or more switching units 42 (although FIG. 4 only shows a single switching 42 for understanding, this is for easy understanding, not a limitation to the present invention); a transmitting unit 44, a receiving unit 46 and a control unit 48. Each switching unit 42 includes: a transistor 410, an input electrode bias resistor 420, an input electrode bias selecting circuit 430, a control electrode bias resistor 440, a control electrode bias selecting circuit 450, an output electrode bias resistor 460 and an output electrode bias selecting circuit 470. Said transistor 410 includes an input electrode, a control electrode and an output electrode; for instance, if the transistor 410 is a NMOS transistor, the input electrode, control electrode and output electrode are the drain, gate and source of the NMOS transistor respectively. Said input electrode bias resistor 420 is coupled with the input electrode; and said input electrode bias selecting circuit 430 is operable to couple the input electrode bias resistor 420 with a first input electrode bias $V_{I1}$ (e.g. the aforementioned grounding voltage) when the transistor is turned on, and couple the input electrode bias resistor 420 with a second input electrode bias $V_{I2}$ (e.g. the aforementioned designated bias $V_{Bias}$) when the transistor 410 is turned off. Said control electrode bias resistor 440 is coupled with the control electrode; and said control electrode bias selecting circuit 450 is operable to couple the control electrode bias resistor 440 with a first control electrode bias $V_{C1}$ (e.g. the aforementioned DC operating voltage $V_{DD}$) when the transistor 410 is switched on, and couple the control electrode bias resistor 440 with a second control electrode bias $V_{C2}$ (e.g. the grounding voltage) when the transistor 410 is switched off. Said output electrode bias resistor is coupled with the output electrode; and said output electrode bias selecting circuit 470 is operable to couple the output electrode bias resistor 460 with a first output electrode bias $V_{O1}$ (e.g. the grounding voltage) when the transistor is turned on, and couple the output electrode bias resistor 460 with a second output electrode bias $V_{O2}$ (e.g. the designated bias $V_{Bias}$) when the transistor 410 is turned off. Besides, said transmitting unit 44 is operable to output a transmission signal (i.e. an AC signal $V_{AC}$) via the one or more switching units 42 while an additional capacitor (not shown) could be set between the transmitting unit 44 and the switching unit 42 to filter low frequency noise off. Said receiving unit 46 is operable to receive a reception signal (i.e. another AC signal $V_{AC}$) via the one or more switching units 42 while another capacitor (not shown) could be set between the receiving unit 46 and the switching unit 42 for low frequency noise filtration. Said control unit 48 is coupled with the switching unit(s) 42, the transmitting unit 44 and the receiving unit 46, and operable to couple the input electrode bias selecting circuit 430 with the first or second input electrode bias, couple the control electrode bias selecting circuit 450 with the first or second control electrode bias, and couple the output electrode bias selecting circuit 470 with the first or second output electrode bias according to a transmission state of the transmitting unit 44 and/or a reception state of the receiving unit 46, wherein the first and second input electrode biases are different, the first and second control electrode biases are different and the first and second output electrode biases are different. In this embodiment, when the transmitting unit 44 executes transmission, the receiving unit 46 suspends reception; however, the present invention is also applicable to a case that the transmitting unit 44 and the receiving unit 46 function concurrently. Since those of ordinary skill in the art can appreciate the present embodiment and the modifications thereto very well by referring to the disclosure related to FIG. 2a through FIG. 3b, repeated and redundant explanation is therefore omitted.

Please note that in the present embodiment each of the transmitting unit 44, the receiving unit 46 and the control unit 48 alone is known in this technique filed, which means that one of ordinary skill in the art can bring these units 44, 46, 48 into practice through well-known arts on the basis of the disclosure of the present invention. Therefore, the detail on these units 44, 46, 48 is omitted here for conciseness. Moreover, in each of the aforementioned embodiments, the parasitic capacitance is generated along with the fabrication of the transistor, and the AC input signal could be a wireless transmission signal, a wireless reception signal or other AC signals. Since the details thereof have little to do with the enablement of the present invention, they are omitted as well. Please also note that the transistor of the semiconductor switch of the present invention can be a silicon transistor, a Gallium Arsenide (GaAs) transistor or other transistors appropriate for this invention. Please further note that the meaning of the term "bias" in this specification is "bias voltage", and the phrase "to couple a resistor with a bias" indicates "to couple a resistor with a node of a bias voltage"; these definition and clarification are clearly shown and sustained by the embodiments and figures of the specification.

In conclusion, the semiconductor switch and the transceiver of the present invention are capable of preventing the negative influence due to overvoltage through the setting of bias resistors, the connection of bias selecting circuits and the limitation to the bias range or voltage drop, and are flexible in the number of the switching units in consideration of different applications. In short, this invention not only improves the reliability of circuits, but also enhances the flexibility of application.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A semiconductor switch applicable to an electronic device, comprising a switching unit which comprises:
   a transistor having a drain, a gate and a source;
   a drain bias resistor coupled to the drain;
   a drain bias selecting circuit to couple the drain bias resistor with a node of a first drain bias voltage when the transistor is turned on, and couple the drain bias resistor with a node of a second drain bias voltage when the transistor is turned off, in which the voltage values at the nodes of the first and second drain bias voltages are independent of the coupling actions of the drain bias selecting circuit;
   a gate bias resistor coupled to the gate;
   a gate bias selecting circuit to couple the gate bias resistor with a node of a first gate bias voltage when the transistor is turned on, and couple the gate bias resistor with a node of a second gate bias voltage when the transistor is turned off, in which the voltage values at the nodes of the first and second gate bias voltages are independent of the coupling actions of the gate bias selecting circuit;
   a source bias resistor coupled to the source; and
   a source bias selecting circuit to couple the source bias resistor with a node of a first source bias voltage when the transistor is turned on, and couple the source bias resistor with a node of a second source bias voltage when the transistor is turned off, in which the voltage values at the nodes of the first and second source bias voltages are independent of the coupling actions of the source bias selecting circuit,
   wherein the first and second drain bias voltages are different, the first and second gate bias voltages are different, and the first and second source bias voltages are different.

2. The semiconductor switch of claim 1, wherein the first drain bias voltage is equivalent to the first source bias voltage and the second drain bias voltage is equivalent to the second source bias voltage.

3. The semiconductor switch of claim 2, wherein the transistor has a breakdown voltage and a threshold voltage, the voltage drop between the second drain bias voltage and the second gate bias voltage is more than a quarter of the breakdown voltage minus the triple of the threshold voltage, and the voltage drop between the second source bias voltage and the second gate bias voltage is more than a quarter of the breakdown voltage minus the triple of the threshold voltage.

4. The semiconductor switch of claim 1, wherein the transistor has a breakdown voltage and a threshold voltage, the voltage drop between the second drain bias voltage and the second gate bias voltage is more than a quarter of the breakdown voltage minus the triple of the threshold voltage, and the voltage drop between the second source bias voltage and the second gate bias voltage is more than a quarter of the breakdown voltage minus the triple of the threshold voltage.

5. The semiconductor switch of claim 4, wherein the voltage drop between the second drain bias voltage and the second gate bias voltage is less than a quarter of triple the breakdown voltage minus the threshold voltage, and the voltage drop between the second source bias voltage and the second gate bias voltage is less than a quarter of triple the breakdown voltage minus the threshold voltage.

6. The semiconductor switch of claim 1, wherein the transistor has a breakdown voltage and a threshold voltage, and the voltage drop between the second drain bias voltage and the second gate bias voltage is less than a quarter of triple the breakdown voltage minus the threshold voltage, and the voltage drop between the second source bias voltage and the second gate bias voltage is less than a quarter of triple the breakdown voltage minus the threshold voltage.

7. The semiconductor switch of claim 1, wherein the electronic device functions according to a DC operating voltage, and each of the second drain and source bias voltages is less than the DC operating voltage.

8. The semiconductor switch of claim 1, wherein the switching unit includes one or more parasitic capacitances, and each of the impedances of the drain bias resistor, the gate bias resistor and the source bias resistor is more than the impedance of any of the one or more parasitic capacitances.

9. The semiconductor switch of claim 8, wherein each of the impedances of the drain bias resistor, the gate bias resistor and the source bias resistor is at least ten times the impedance of any of the one or more parasitic capacitances.

10. The semiconductor switch of claim 1, wherein the first gate bias voltage is different from each of the second gate bias voltage, the first and second drain bias voltages, and the first and second source bias voltages.

11. The semiconductor switch of claim 1, wherein the first drain bias voltage, the second gate bias voltage and the first source bias voltage are equivalent to a first voltage regardless of the coupling actions of the drain, gate and source bias selecting circuits, the second drain bias voltage and the second source bias voltage are equivalent to a second voltage regardless of the coupling actions of the drain and source bias selecting circuits while the second voltage is different from the first voltage, and the first gate bias voltage is equivalent to a third voltage regardless of the coupling actions of the gate bias selecting circuit while the third voltage is different from each of the first and second voltages.

12. The semiconductor switch of claim 11, wherein the first voltage is a grounding voltage, the second voltage is a designated voltage higher than the grounding voltage, and the third voltage is an operating voltage higher than the grounding voltage.

13. The semiconductor switch of claim 12, wherein the operating voltage is higher than the designated voltage.

14. A semiconductor switch applicable to an electronic device, comprising a plurality of switching units, each of which comprises:
   a transistor having a drain, a gate and a source;
   a drain bias resistor coupled to the drain;
   a drain bias selecting circuit to couple the drain bias resistor with a node of a first drain bias voltage when the transistor is turned on, and couple the drain bias resistor with a node of a second drain bias voltage when the transistor is turned off, in which the coupling actions of the drain bias selecting circuit are unrelated to the voltage values at the nodes of the first and second drain bias voltages;
   a gate bias resistor coupled to the gate;
   a gate bias selecting circuit to couple the gate bias resistor with a node of a first gate bias voltage when the transistor is turned on, and couple the gate bias resistor with a node of a second gate bias voltage when the transistor is turned off, in which the coupling actions of the gate bias selecting circuit are unrelated to the voltage values at the nodes of the first and second gate bias voltages;
   a source bias resistor coupled to the source; and
   a source bias selecting circuit to couple the source bias resistor with a node of a first source bias voltage when the transistor is turned on, and couple the source bias resistor with a node of a second source bias voltage when the transistor is turned off, in which the coupling actions of the source bias selecting circuit are unrelated to the voltage values at the nodes of the first and second source bias voltages, wherein the first and second drain bias voltages are different, the first and second gate bias voltages are different, the first and second source bias voltages are different, and the plurality of switching units includes a first switching unit and a second switching unit while the source of the first switching unit is serially connected with the drain of the second switching unit and the source bias resistor of the first switching is the drain bias resistor of the second switching unit.

15. The semiconductor switch of claim 14, wherein the first gate bias voltage is different from each of the second gate bias voltage, the first and second drain bias voltages, and the first and second source bias voltages.

16. The semiconductor switch of claim 14, wherein the first drain bias voltage, the second gate bias voltage and the first source bias voltage are equivalent to a first voltage regardless of the coupling actions of the drain, gate and source bias selecting circuits, the second drain bias voltage and the second source bias voltage are equivalent to a second voltage regardless of the coupling actions of the drain and source bias selecting circuits while the second voltage is different from the first voltage, and the first gate bias voltage is equivalent to a third voltage regardless of the coupling actions of the gate bias selecting circuit while the third voltage is different from each of the first and second voltages.

17. The semiconductor switch of claim 16, wherein the first voltage is a grounding voltage, the second voltage is a designated voltage higher than the grounding voltage, and the third voltage is an operating voltage higher than the designated voltage.

18. The semiconductor switch of claim 14, wherein the first drain bias voltage, the second gate bias voltage and the first source bias voltage are equivalent to a first voltage regardless of the coupling actions of the drain, gate and source bias selecting circuits, the second drain bias voltage and the second source bias voltage are equivalent to a second voltage regardless of the coupling actions of the drain and source bias selecting circuits while the second voltage is different from the first voltage, and the first gate bias voltage is equivalent to a third voltage regardless of the coupling actions of the gate bias selecting circuit while the third voltage is different from each of the first and second voltages.

19. A semiconductor switch applicable to an electronic device, comprising a switching unit which comprises:
    a transistor having a drain, a gate and a source;
    a drain bias resistor coupled to the drain;
    a drain bias selecting circuit operable to couple the drain bias resistor with a node of a first drain bias voltage by passing through the drain bias selecting circuit itself when the transistor is turned on, and couple the drain bias resistor with a node of a second drain bias voltage by passing through the drain bias selecting circuit itself when the transistor is turned off;
    a gate bias resistor coupled to the gate;
    a gate bias selecting circuit operable to couple the gate bias resistor with a node of a first gate bias voltage by passing through the gate bias selecting circuit itself when the transistor is turned on, and couple the gate bias resistor with a node of a second gate bias voltage by passing through the gate bias selecting circuit itself when the transistor is turned off;
    a source bias resistor coupled to the source; and
    a source bias selecting circuit operable to couple the source bias resistor with a node of a first source bias voltage by passing through the source bias selecting circuit itself when the transistor is turned on, and couple the source bias resistor with a node of a second source bias voltage by passing through the source bias selecting circuit itself when the transistor is turned off,
    wherein the first and second drain bias voltages are different, the first and second gate bias voltages are different, and the first and second source bias voltages are different.

20. The semiconductor switch of claim 19, wherein the first gate bias voltage is different from each of the second gate bias voltage, the first and second drain bias voltages, and the first and second source bias voltages.

* * * * *